(12) United States Patent
Balasinski et al.

(10) Patent No.: US 6,681,376 B1
(45) Date of Patent: Jan. 20, 2004

(54) INTEGRATED SCHEME FOR SEMICONDUCTOR DEVICE VERIFICATION

(75) Inventors: Artur Balasinski, Cupertino, CA (US); Linard Karklin, Sunnyvale, CA (US); Valery Axelrad, Woodside, CA (US)

(73) Assignees: Cypress Semiconductor Corporation, San Jose, CA (US); Numerical Technologies, Inc., San Jose, CA (US); Sequoia Design Systems, Woodside, CA (US)

( * ) Notice: Subject to any disclaimer, the term of this patent is extended or adjusted under 35 U.S.C. 154(b) by 0 days.

(21) Appl. No.: 09/982,525

(22) Filed: Oct. 17, 2001

(51) Int. Cl.[7] ............................................. G06F 17/50
(52) U.S. Cl. ..................... 716/4; 716/2; 716/7; 716/14; 716/19
(58) Field of Search ............................. 716/4, 2, 7, 14, 716/19

(56) References Cited

U.S. PATENT DOCUMENTS

| | | | | |
|---|---|---|---|---|
| 3,751,647 A | * | 8/1973 | Maeder et al. | 713/401 |
| 3,842,491 A | * | 10/1974 | Depuy et al. | 438/14 |
| 5,432,587 A | * | 7/1995 | Nozue | 355/53 |
| 5,598,341 A | * | 1/1997 | Ling et al. | 700/110 |
| 5,815,404 A | * | 9/1998 | Goetting et al. | 716/16 |
| 6,178,539 B1 | * | 1/2001 | Papadopoulou et al. | 716/7 |
| 6,317,859 B1 | * | 11/2001 | Papadopoulou | 716/4 |
| 6,449,749 B1 | * | 9/2002 | Stine | 716/4 |
| 6,496,958 B1 | * | 12/2002 | Ott et al. | 716/4 |
| 6,499,007 B1 | * | 12/2002 | Kuroki et al. | 703/22 |
| 6,546,523 B1 | * | 4/2003 | Boorananut et al. | 716/4 |
| 6,560,766 B2 | * | 5/2003 | Pierrat et al. | 716/19 |
| 6,562,638 B1 | * | 5/2003 | Balasinski et al. | 438/14 |

OTHER PUBLICATIONS

Balasinski et al., A novel approach to stimulate the effect of optical proximity on MOSFET parametric yield Electron Devices Meeting, 1999. IEDM Technical Digest. International, Dec. 5–8, 1999 Page(s): 913–916.*

Leiker et al., Statistical construction of a representative CAD model from a measured population for RF design applications Microwave Symposium Digest, 2001 IEEE MTT–S International , vol.: 3, May 20 2001.*

Michael et al., Statistical techniques for the computer–aided optimization of analog integrated circuit Circuits and Systems I: Fundamental Theory and Applications, III Transactions on , vol.: 43 Issue: 5.*

U.S. patent application Ser. No. 09/753,137, filed Dec. 29, 2000, pending.

* cited by examiner

Primary Examiner—Matthew Smith
Assistant Examiner—Andrea Liu
(74) Attorney, Agent, or Firm—Sonnenschein Nath & Rosenthal LLP

(57) ABSTRACT

A method for determining device yield of a semiconductor device design, comprises determining statistics of at least one device parameter from at least two device layer patterns; and calculating device yield from the statistics. At least one of the device layer patterns is neither a diffusion layer pattern nor a gate poly layer pattern.

26 Claims, 5 Drawing Sheets

INTEGRATED SCHEME FOR SEMICONDUCTOR DEVICE VERIFICATION

BACKGROUND OF THE INVENTION

The present invention relates to an integrated scheme for semiconductor devices verification.

Markets for memory-based products are explosively growing in the recent years. This growth makes it necessary to reduce development cycle time and increase fabrication facility throughput. As devices shrink with each succeeding generation, and standard cell libraries continuously grow to accommodate increasingly more complex applications, the layouts become extremely dense. High layout density is also required for all the cells adjacent to the memory core, in order to preserve the pitch of interconnecting lines.

In order to expedite new product introduction, manufacturability of the various cells often needs to be analyzed based on optical and device simulations. Such simulations, however, have not been adequately integrated and have not been able to predict complex issues related to design performance.

In a standard product design flow, the first step to verify manufacturability is a design rule check (DRC), based on the inputs from technology development and implemented by CAD (computer aided design). Design rules typically verify. dependencies related to process integration, among features drawn on different layers. In addition, one can verify properties of the individual mask layers, i.e., including process related sizing, pattern enhancement features, etc. Mask layer verification has recently become supplemented by optical simulation of the photoresist pattern. However, DRC of such simulated layouts does not provide information about the manufacturability of the devices realized by the proposed layouts. Single-level simulation can provide the insight into what the difference is between the drawn (target) and the final photoresist pattern on wafer, based on the intermediate mask stage. However, it cannot demonstrate how critical the difference could be between the drawn and final features, especially for MOSFET channels and contact areas.

BRIEF SUMMARY

In a first aspect, the present invention is a method for determining device yield of a semiconductor device design, comprising determining statistics of at least one device parameter from at least two device layer patterns; and calculating device yield from the statistics. At least one of the device layer patterns is neither a diffusion layer pattern nor a gate poly layer pattern.

In a second aspect, the present invention is a method of preparing a semiconductor device, comprising determining device yield of a semiconductor device design, and producing a device corresponding to the semiconductor device design.

In a third aspect, the present invention is a computer program product on a computer readable medium, for determining device yield, comprising code in the computer readable medium for causing a computer to determine statistics of at least one device parameter from at least two device layer patterns, and code in the computer readable medium for causing a computer to calculate device yield from the statistics. At least one of said device layer patterns is neither a diffusion layer nor a gate poly layer.

In a fourth aspect, the present invention is a method of making an electronic device, comprising preparing a semiconductor device by the above method, and preparing an electronic device comprising the semiconductor device.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views and wherein.

DETAILED DESCRIPTION

The present invention includes an integrated simulation scheme for comprehensive layout optimization; on-wafer layers of the device are simulated and overlaid, and then device parameters are extracted from the overlaid images.

Previously, some statistics of MOSFET parameters have been determined from the gate pattern derived by photolithographic simulations; these were then used to determine device yield (see U.S. patent application Ser. No. 09/753, 137, filed Dec. 29, 2000, hereby incorporated by reference). This was carried out by producing a statistical description of the channel Lpoly (gate length), or poly linewidth, from photolithographic simulations, producing a statistical description of the device parameters (which may be a function of Lpoly), such as drive current, drive current, etc., and then calculate the device yield. The statistical description of one or more MOSFET parameters may be in the form of a histogram. This allowed predicting and optimizing product yield and performance by improving pattern control and reducing device sensitivity to the quality of pattern reproduction. However, this only examined two layers together: the diffusion layer and the poly layer. Since other layers were not considered, other device parameters, which depend on the interaction with these other layers, could not be extracted from the simulation.

In the present invention, more layers may be optically simulated, for example the diffusion (active) layer, N+ implant, P+ implant, the poly layer, the contact layer, the local interconnect layer (Met), as well as the first, second, etc. metallization layers and via layers, generating a simulation for each relevant critical dimension (CD) option. For each pair of layers that has been simulated, the various misalignment options are examined, producing an electrical simulation from which device parameters may be extracted. These allow full simulation, and therefore cell layout verification. The statistics of device parameters may be compared to yield criteria, to determine the device yield for a given design (i.e., the percentage of devices produced the meet desired specifications).

Figure 1:
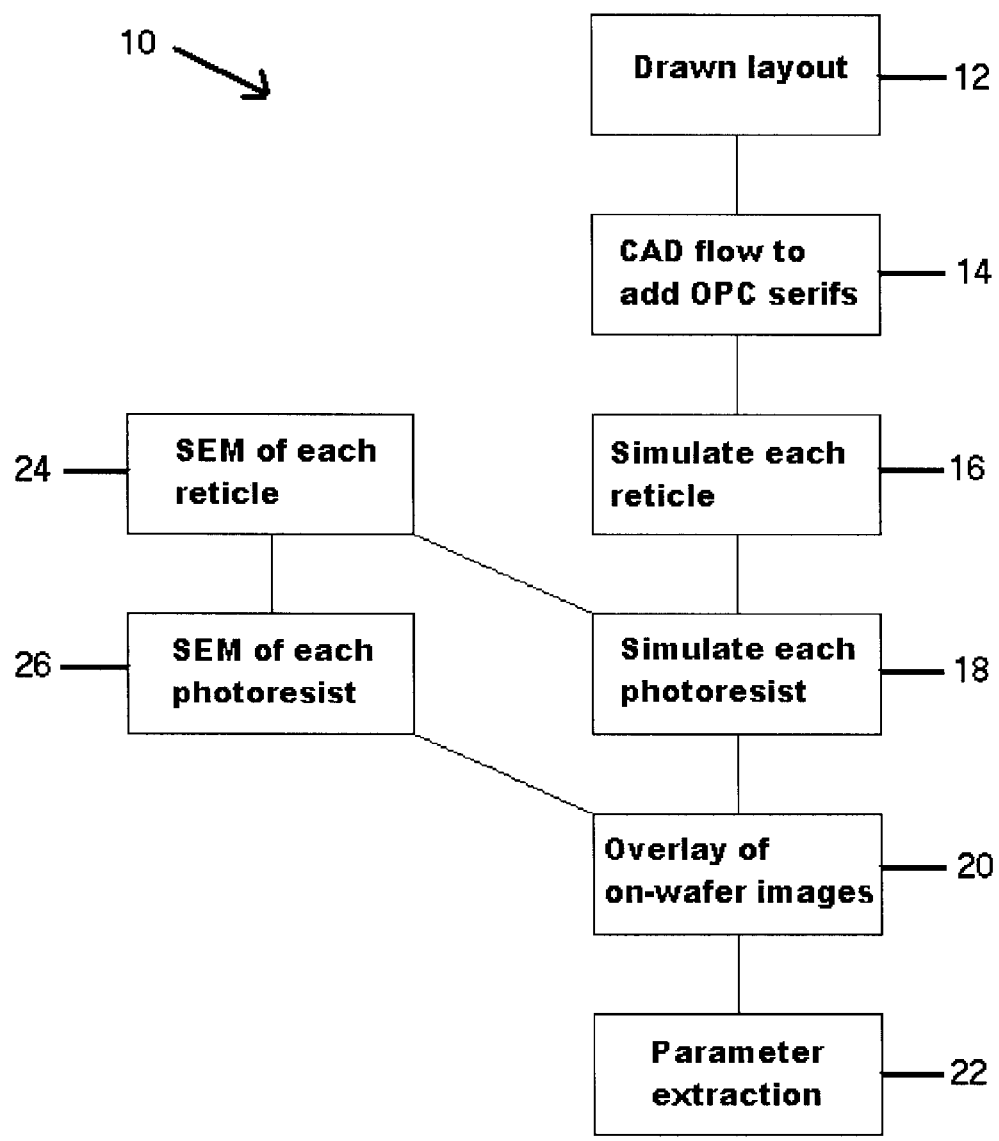
FIG. 1 is a flow chart of a method of the invention.

FIG. 1 is a flow chart 10 of a method of the present invention. In this method, the device to be simulated is prepared as a set of drawn layouts 12 of each layer (i.e., the drawn pattern of each layer). CAD flow may be used to add OPC (optical proximity correction) serifs 14, to the drawn layouts to improve the final transfer to on-wafer structures.

Next, the each mask (reticle) is simulated 16, and then the photoresist, which would be used for each mask is simulated 18. Alternatively, one or more of the reticles may be prepared, and a scanning electron microscope (SEM) image 24 of the one or more reticles may be used to instead of one or more of the simulated reticles. Likewise, one or more of the photoresist layers may be prepared, and a scanning electron micrograph (SEM) 26 of the one or more photoresist layers may be used to instead of one or more of the simulated photoresist layers.

The on-wafer structures may then be simulated from the photoresist images, and overlaid 20. The actual P+, N+ and MOSFET channel region images may be used rather than the simulated versions. Once the images (e.g., intensity contour aerial images) have been overlaid, various device parameters may be extracted 22.

Figure 2:
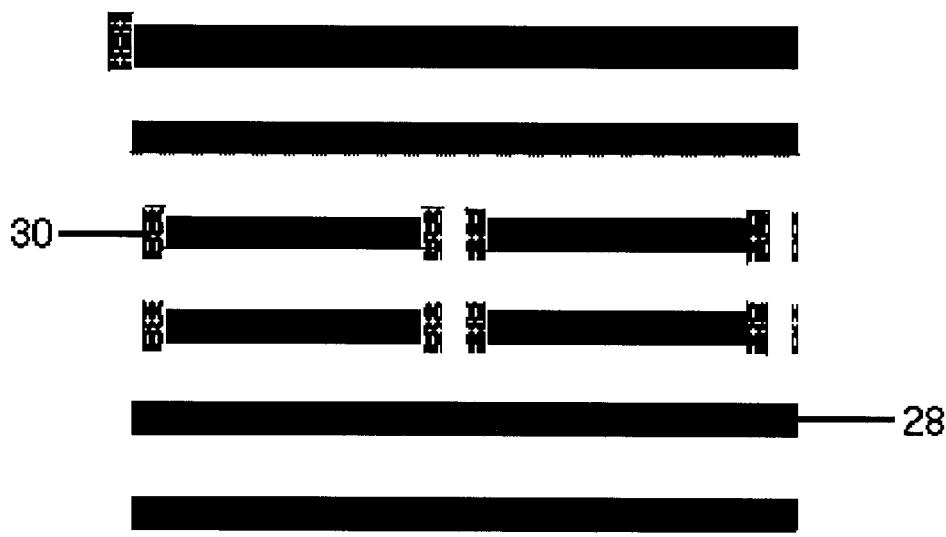
FIG. 2 shows a drawn layout of a polysilicon (poly) layer of a semiconductor device.
Figure 3:
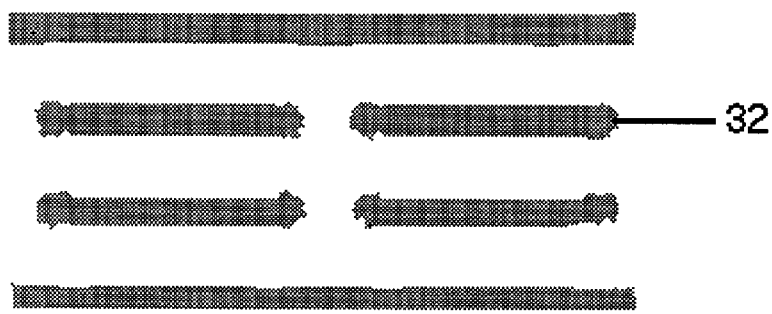
FIG. 3 shows the simulated pattern of poly on the substrate, generated from the drawn layout.

Individually, the preparation of a drawn layout, CAD flow to add OPC serifs, simulation of reticles, simulation of photoresists, and preparation of SEMs of photoresists and reticles, are well known to those of ordinary skill in the are, and are described, for example, in U.S. patent application Ser. No. 09/753,137. FIG. 2 illustrates a drawn layout of a poly layer 28 with serifs (hammerheads) 30 added. FIG. 3 shows a simulation of the on-wafer poly layer 32.

DRC may be run on the drawn and mask layer, both intra-layer (photo capability) and inter-layer (integration). The optical simulation may be used to determine process window and establish contours for CD variation. Also, optical DRC may be run on the simulated silicon image.

For individual layers, DRC rules include width and space of line to line, line end to line end, line end to line. For integration, DRC rules include the extension of active beyond poly (min. drain/source), extension of poly beyond active (endcaps), and spacing of poly on field to active (corner rounding). For the contact layer, DRC rules included contact CD and space, enclosure by active or poly, spacing to active or poly, and spacing of contact on active to poly. For the local interconnect, DRC rules include width and space, enclosure by metal, and spacing to metal.

Figure 4:
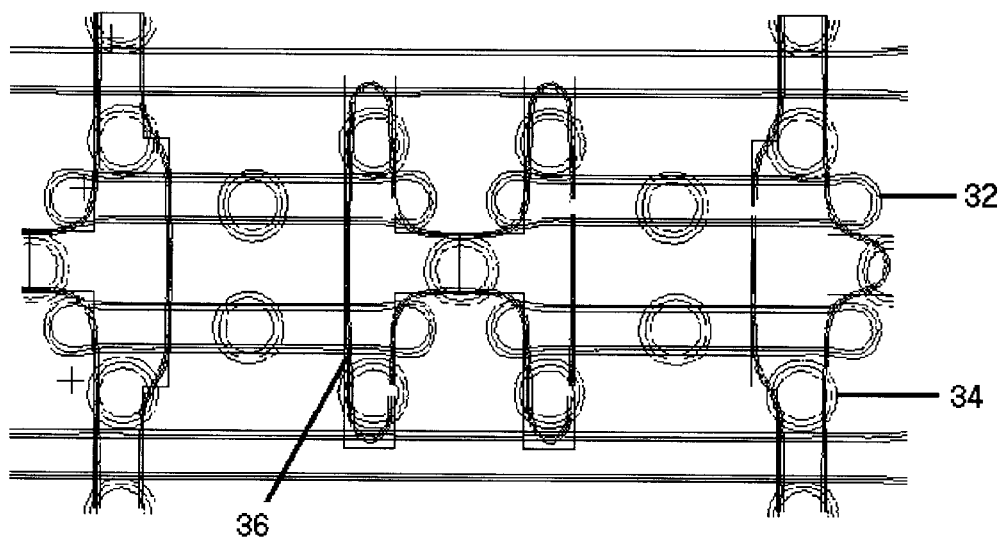
FIG. 4 shows the overlay of the poly layer, the diffusion layer, and the contacts layer.

FIG. 4 is the overlaid images of the poly layer 32, the diffusion layer 36, and the contact layer 34. The triple lines of the layers represent three variations of the critical dimensions (CD's): Maximum (max.), nominal, and minimum (min.), based on CD+3σ, CD, and CD−3σ, respectively. Typically, all layers are aligned to the diffusion layer. From the overlaid images of FIG. 4, it is possible to verify nominal endcaps and contact areas. Furthermore, DRC may be run on the simulated contours; this procedure may be automated.

In addition to preparing overlays of each layer with these variations in the CD's, each permutation of misalignment between layers should also be considered. These can be determined for the specification and tolerances of the fabrication systems they will be used to make the semiconductor device, including stepper type, stepper CD, mask overlay tolerances, and process bias (sizing) for each layer. Furthermore, lens aberration, photoresist properties and MEEF, may also be taken into account. For example, the Table below illustrates different device parameters and the various layer misalignment permutation between layers that are relevant to each parameter.

TABLE

| | CD and misalignment options for the windowing of electrical parameters | | | | |
|---|---|---|---|---|---|
| Parameter | Diff | Poly | Cont | Met | Misalign. |
| I ON | — | + | N/a | N/a | 4 |
| I OFF | + | — | N/a | N/a | 4 |
| Diff cont | — | + | — | N/a | 16 |
| Poly cont | N/a | — | — | N/a | 4 |
| Met shorts | N/a | N/a | + | + | 4 |
| Met opens | N/a | N/a | — | — | 4 |

In the table: +:max. CD, −:min. CD. The right column shows the number of misalignment options; Diff: diffusion layer, Poly: poly layer, Cont: contact layer, and Met: local interconnect layer; I ON: drive current, I OFF: leakage current, Diff cont: diffusion contact resistance, Poly cont: poly contact resistance, Met shorts: the resistance of local interconnect short circuits, and Met opens: the resistance of local interconnect contacts.

As an example, to evaluate if I OFF is within specifications, one needs to examine small poly endcaps, big active regions, and up to four misalignment options that can be reduced for symmetrical cell geometries. As another example, to evaluate if I ON is within specifications, one needs to examine large poly endcaps ("elephant foot effect"), narrow active regions, and up to four misalignment options that can be reduced for symmetrical cell geometries. Device current can be extracted from the channel geometries by (a) simulating FET gate silicon image, (b) cutting the gate into multiple slices, and (c) applying assumed FET model to each slice independently. This is described in U.S. patent application Ser. No. 09/753,137.

Figure 5:
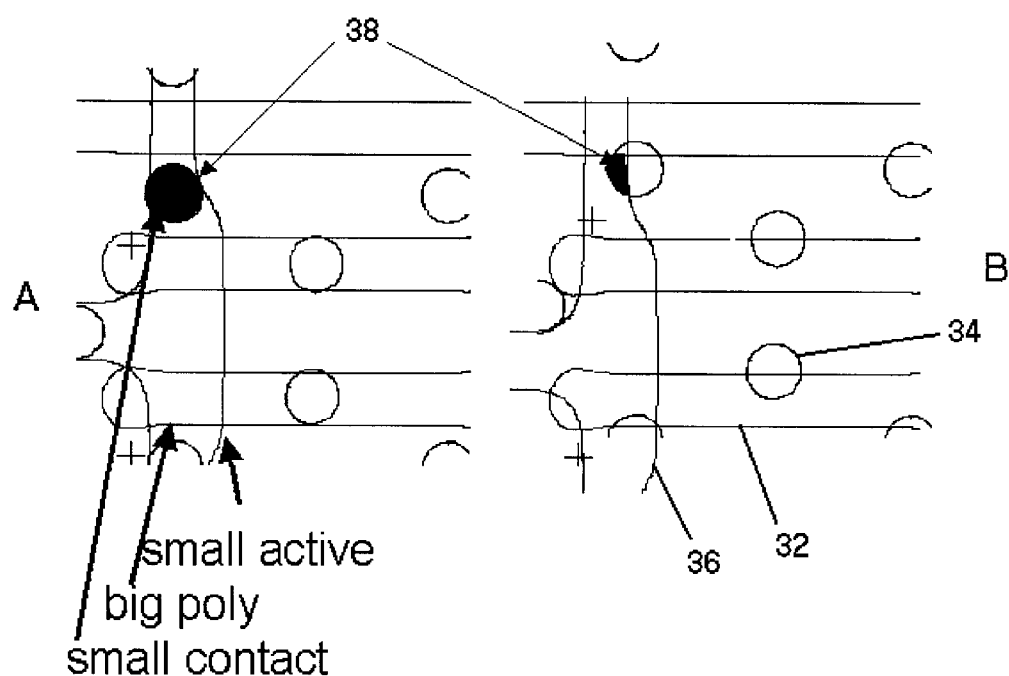
FIGS. 5A and B show a nominal, and a misaligned, overlays of the diffusion layer and the contacts layer, respectively.
Figure 6:
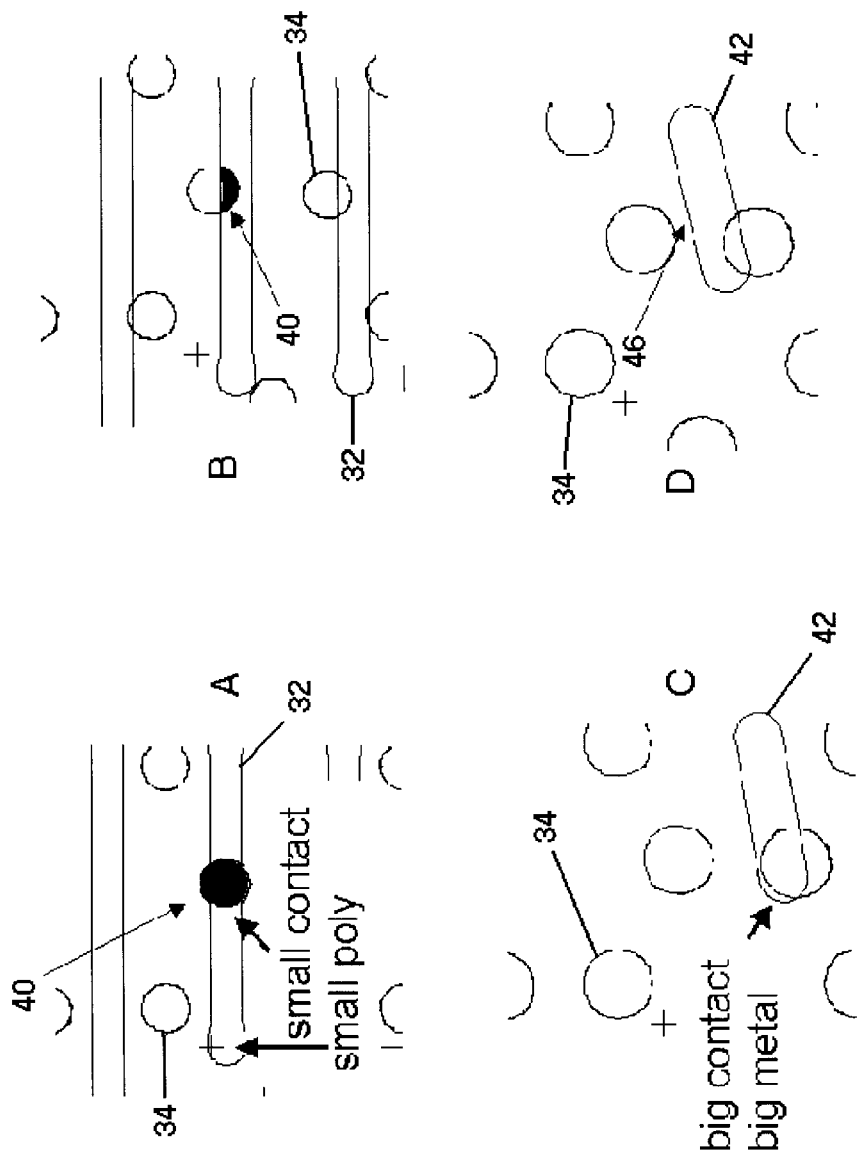
FIGS. 6A and B show a nominal, and a misaligned, overlays of the poly layer and the contacts layer, respectively.
FIGS. 6C and D show a nominal, and a misaligned, overlays of the metal layer and the contacts layer, respectively.

FIGS. 5 and 6 illustrate how contact properties may be extracted. FIG. 5A shows the nominal (not misaligned) images for the diffusion layer with CD−3σ, the poly layer with CD+3σ, and the contact layer with CD+3σ. FIG. 5B shows the same layers, with one of the 16 possible misalignment options. Here, misalignment causes a reduction of the contact area 38 due to encroachment onto the spacer and field oxide. The resistance of each contact to diffusion may be evaluated based on the nominal area of the contact minus spacer encroachment in the misalignment options. Similarly, FIG. 6A shows the nominal images for the contact layer with CD−3σ, and the poly layer with CD−3σ; FIG. 6B shows the same layers, with one of the 4 possible misalignment options. Again, comparison of the contact area 40 between the nominal and misalignment option may be used to determine the resistance of each contact to poly. Also similarly, FIG. 6C shows the nominal images for the contact layer with CD+3σ, and the first metallization (metal) layer with CD+3σ; FIG. 6C shows the same layers, with one of the 4 possible misalignment options. Here, examination of the images can locate shorts 46 between contacts and adjacent metal lines.

The information related to any parameter may be collected and analyzed statistically, and/or represented as a histogram. The data can then compared to yield criteria to determine parametric yield of the device.

The present invention may be used to determine the device yield of, and design, any semiconductor device, such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

As an example of the integrated simulation scheme of the present invention, a double wordline SRAM cell designed for 0.12 um geometry was used. The effect of mask error enhancement factor (MEEF), optical distortions and misalignment was evaluated for key layers subject to the most critical and dense rules: diffusion layer, poly gate layer, contact layer, and the metal layer (local interconnect layer). Parameters chosen to evaluate design quality were MOSFET drive and leakage currents, contact resistance, and metal/contact opens and shorts.

First, photoresist (PR) images of an SRAM cell were simulated, based on pattern enhancement techniques for an optimized layout. CD variations of mask making and photolithography processes in accordance with the appropriate specifications were assumed. Then, on-wafer overlay images using worst case misalignment and CD variation for every failure mode were generated (as shown in the Table). All simulations were run using WORKBENCH software from NTI linked with device extractor from SEQUOIA DESIGN SYSTEMS (NUMERICAL TECHNOLOGIES of San Jose, Calif.).

MOSFET parameters were extracted for misalignment options in 4 orthoganol direction (north/south/east/west) using a procedure proposed by A. Balasinski et al., IEDM'99, p. 913, hereby incorporated by reference. Contact resistances were evaluated based on the overlay area, and open/short metal lines were verified based on the allowed spacing between the simulated PR contours.

In order to fully evaluate the manufacturability of cell design, one needs to run 36 simulations followed by parameter extraction. Such full loop of the simulation is still much less complex compared to design verification on silicon.

Obviously, numerous modifications and variations of the present invention are possible in light of the above teachings. It is therefore to be understood that within the scope of the appended claims, the invention may be practiced otherwise than as specifically described herein.

What is claimed is:

1. A method for determining device yield of a semiconductor device design, comprising:
   determining statistics of at least one device parameter from drawn layouts of at least two layers; and
   calculating device yield from the statistics;
   wherein at least one of said layers is not a diffusion layer nor a gate poly layer.

2. The method of claim 1, further comprising determining at least one of the device layer patterns from at least on drawn pattern.

3. The method of claim 2, wherein said determining the at least one of said device layer patterns comprises simulating at least one photoresist pattern.

4. The method of claim 3, wherein said determining the at least one of said device layer patterns further comprises simulating at least one reticle pattern.

5. The method of claim 1, further comprising determining a plurality of the at least one of said device layer patterns from a plurality of drawn patterns.

6. The method of claim 1, further comprising determining all of the at least one of said device layer patterns from a plurality of drawn patterns.

7. The method of claim 1, wherein said at least one device parameter comprises at least one member selected from the group consisting of drive current, leakage current, diffusion contact resistance, poly contact resistance, resistance of local interconnect short circuits, and resistance of local interconnect contacts.

8. The method of claim 1, wherein said at least one device parameter comprises at least one member selected from the group consisting of diffusion contact resistance, poly contact resistance, resistance of local interconnect short circuits, and resistance of local interconnect contacts that are open.

9. The method of claim 1, wherein said at least one device parameter comprises drive current, leakage current, diffusion contact resistance, poly contact resistance, resistance of local interconnect short circuits, and resistance of local interconnect contacts that are open.

10. The method of claim 1, wherein said at least one device parameter comprises diffusion contact resistance, poly contact resistance, resistance of local interconnect short circuits, and resistance of local interconnect contacts that are open.

11. The method of claim 1, wherein at least one of said device layer patterns is a contact layer pattern, a local interconnect pattern, a metallization pattern, or a via pattern.

12. A method of preparing a semiconductor device, comprising:
   determining device yield of a semiconductor device design by the method of claim 1, and
   producing a device corresponding to the semiconductor device design.

13. A method of making an electronic device, comprising: preparing a semiconductor device by the method of claim 12, and preparing an electronic device comprising said semiconductor device.

14. The method of claim 1, wherein:
   said determining statistics comprises step for determining statistics of at least one device parameter from at least two device layer patterns, and
   said calculating device yield comprises step for calculating device yield from the statistics.

15. A computer program product on a computer readable medium, for determining device yield, comprising:
   code in the computer readable medium for causing a computer to determine statistics of at least one device parameter from drawn layouts of at least two layers, and
   code in the computer readable medium for causing a computer to calculate device yield from the statistics,
   wherein at least one of said layers is not a diffusion layer nor a gate poly layer.

16. The computer program product of claim 15, further comprising code in the computer readable medium for causing a computer to determine at least one of the device layer patterns from at least one drawn pattern.

17. The computer program product of claim 16, wherein said code for causing a computer to determine the at least one of said device layer patterns comprises code for causing a computer to simulate at least one photoresist pattern.

18. The computer program product of claim 17, wherein said code for causing a computer to determine the at least one of said device layer patterns comprises code for causing a computer to simulate at least one reticle patter.

19. The computer program product of claim 15, further comprising code in the computer readable medium for causing a computer to determine a plurality of the at least one of said device layer patters from a plurality of drawn patterns.

20. The computer program product of claim 15, further comprising code in the computer readable medium for causing a computer to determine all of the at least one of said device layer patterns from a plurality of drawn patterns.

21. The computer program product of claim 15, wherein said at least one device parameter comprises at least one member selected from the group consisting of drive current, leakage current, diffusion contact resistance, poly contact resistance, resistance of local interconnect short circuits, and resistance of local interconnect contacts that are open.

22. The computer program product of claim 15, wherein said at least one device parameter comprises at least one member selected from the group consisting of diffusion contact resistance, poly contact resistance, resistance of local interconnect short circuits, and resistance of local interconnect contacts that are open.

23. The computer program product of claim 15, wherein said at least one device parameter comprises drive current, leakage current, diffusion contact resistance, poly contact resistance, resistance of local interconnect short circuits, and resistance of local interconnect contacts that are open.

24. The computer program product of claim 15, wherein said at least one device parameter comprises diffusion contact resistance, poly contact resistance, resistance of local interconnect short circuits, and resistance of local interconnect contacts that are open.

25. The computer program product of claim 15, wherein at least one of said device layer patterns is a contact layer pattern, a local interconnect pattern, a metallization pattern, or a via pattern.

26. The computer program product of claim 15, wherein:
said code for causing a computer to determine statistics comprises means for determining statistics of at least one device parameter from at least two device layer patterns, and
said code for causing a computer to calculate device yield comprises means for calculating device yield from the statistics.

* * * * *

UNITED STATES PATENT AND TRADEMARK OFFICE
CERTIFICATE OF CORRECTION

PATENT NO. : 6,681,376 B1
DATED : January 20, 2004
INVENTOR(S) : Artur Balasinski, Linard Karklin and Valery Axelrad It is certified that error appears in the above-identified patent and that said Letters Patent is hereby corrected as shown below:

Column 5,
Lines 52-53, delete "on drawn pattern" and insert -- one drawn pattern --.

Column 6,
Line 60, delete "patter" and insert -- pattern --.

Signed and Sealed this

Seventh Day of March, 2006

JON W. DUDAS
*Director of the United States Patent and Trademark Office*